(12) United States Patent
Forehand

(10) Patent No.: US 6,342,802 B1
(45) Date of Patent: Jan. 29, 2002

(54) MULTI-VOLTAGE POWER-UP STABLE INPUT/OUTPUT BUFFER CIRCUIT IN A DISC DRIVE

(75) Inventor: Monty Aaron Forehand, Yukon, OK (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/575,970

(22) Filed: May 23, 2000

Related U.S. Application Data

(60) Provisional application No. 60/162,270, filed on Oct. 28, 1999.

(51) Int. Cl.[7] ............................................. H03K 3/02
(52) U.S. Cl. ....................................... 327/198; 327/143
(58) Field of Search ................................. 327/143, 198, 327/545

(56) References Cited

U.S. PATENT DOCUMENTS

| | | | |
|---|---|---|---|
| 3,919,568 A | | 11/1975 | Minner |
| 4,142,118 A | * | 2/1979 | Guritz ........................ 327/143 |
| 5,300,835 A | | 4/1994 | Assar et al. |
| 5,440,244 A | | 8/1995 | Richter et al. |
| 5,508,649 A | * | 4/1996 | Shay ........................... 327/143 |
| 5,537,077 A | * | 7/1996 | Schnizlein ................... 327/143 |
| 5,570,050 A | * | 10/1996 | Conary ....................... 327/143 |
| 5,737,612 A | * | 4/1998 | Ansel et al. ................. 327/143 |
| 5,821,787 A | * | 10/1998 | McClintock et al. ........ 327/143 |
| 5,852,370 A | | 12/1998 | Ko |
| 5,870,617 A | | 2/1999 | Walsh et al. |
| 5,900,750 A | | 5/1999 | Schmitt |
| 5,958,026 A | | 9/1999 | Goetting et al. |
| 5,963,057 A | | 10/1999 | Schmitt et al. |
| 5,990,730 A | * | 11/1999 | Shinozaki .................... 327/544 |
| 6,028,449 A | | 2/2000 | Schmitt |
| 6,246,272 B1 | * | 6/2001 | Takai ........................... 327/143 |

OTHER PUBLICATIONS

Apr. 1989 IBM Technical Disclosure Bulletin, vol. 31, No. 11, pp. 413–416.

* cited by examiner

*Primary Examiner*—Terry D. Cunningham
(74) *Attorney, Agent, or Firm*—John R. Wahl; Merchant & Gould P.C.

(57) ABSTRACT

An integrated circuit for particular use in a disc drive has a core logic module connected to a core voltage, an input/output buffer module connected to an input/output voltage and having input/output buffer control lines connected to the core logic module, and a mode switch input on the I/O buffer module that is operable to prevent output operation of the I/O buffer module whenever core voltage is below a safe operating level. One embodiment has the core logic module determining when the safe operating level is met and providing an appropriate signal to the I/O buffer. Another embodiment has a separate level detect module operably connected to the core voltage and the input/output voltage determining when the safe operating level is met, and having an output connected to the mode switch input on the I/O buffer module.

12 Claims, 4 Drawing Sheets

MULTI-VOLTAGE POWER-UP STABLE INPUT/OUTPUT BUFFER CIRCUIT IN A DISC DRIVE

RELATED APPLICATIONS

This application claims the benefit of priority of United States Provisional Patent Application Serial No. 60/162,270, filed Oct. 28, 1999.

FIELD OF THE INVENTION

This invention generally relates to input/output (I/O) buffer circuits and more particularly to a multiple voltage I/O buffer that is stable on power up.

BACKGROUND OF THE INVENTION

Some advanced integrated circuits (ICs) have two distinct voltages present in the IC. There is a core voltage and an I/O voltage. Each is different than the other. These are called mixed voltage integrated circuits. When the two distinct voltages are applied to and removed from the chip, as when applied to a system implementation, they are often applied or removed at differing time points. Additionally, the state of the Input/Output (I/O) buffers is determined by logic in the core of the IC. This means that both voltages must be present, before the state of the output buffer is determinate. Usually, the core voltage will be present at the same time as the I/O voltage. However, in the case where the I/O voltage is present prior to the core voltage, there is a problem. The problem arises because there are certain signals such as a system reset, for instance, that need to be controlled, i.e., made determinate, anytime the I/O voltage is present, regardless of whether a core voltage is present.

The state of the I/O buffer cannot be solely determined by the I/O power, due to a requirement for Test Modes, and on-the-fly configuration of the buffer. Therefore there is a need for a solution in which the I/O buffer state is made determinate whenever an I/O voltage is present in a mixed voltage integrated circuit.

SUMMARY OF THE INVENTION

Against this backdrop the present invention has been developed. The present invention essentially is an integrated circuit particularly useful in a disc drive controller that ensures that the I/O buffers each power up to a known state based off of the I/O voltage. The circuitry then allows the core to determine the state of the I/O buffers only after the core voltage has reached a predetermined acceptable level. This is accomplished by supplying core power to an additional logic which resides within the I/O buffer itself. In addition, an input to the I/O buffer may be provided which functions as a mode switch from the core logic. This mode switch input controls whether the I/O buffer state is determined by the default mode or by the core logic.

There are two preferred embodiments by which this can be achieved in a disc drive that are presently envisioned. However, other means will also become apparent to those skilled in the art upon reading the following description. The first embodiment basically involves the use of a high active signal from the core to determine when to switch from the Default Mode to the Core Logic Mode. The second embodiment basically involves using a separate level detect signal circuit outside the core that provides a signal to indicate that the Core Voltage is at an acceptable level to control the core logic. The level detect signal then is used to switch between the Default Mode and the Core Logic Mode.

These and various other features as well as advantages that characterize the present invention will be apparent from a reading of the following detailed description and a review of the associated drawings.

Figure 1:
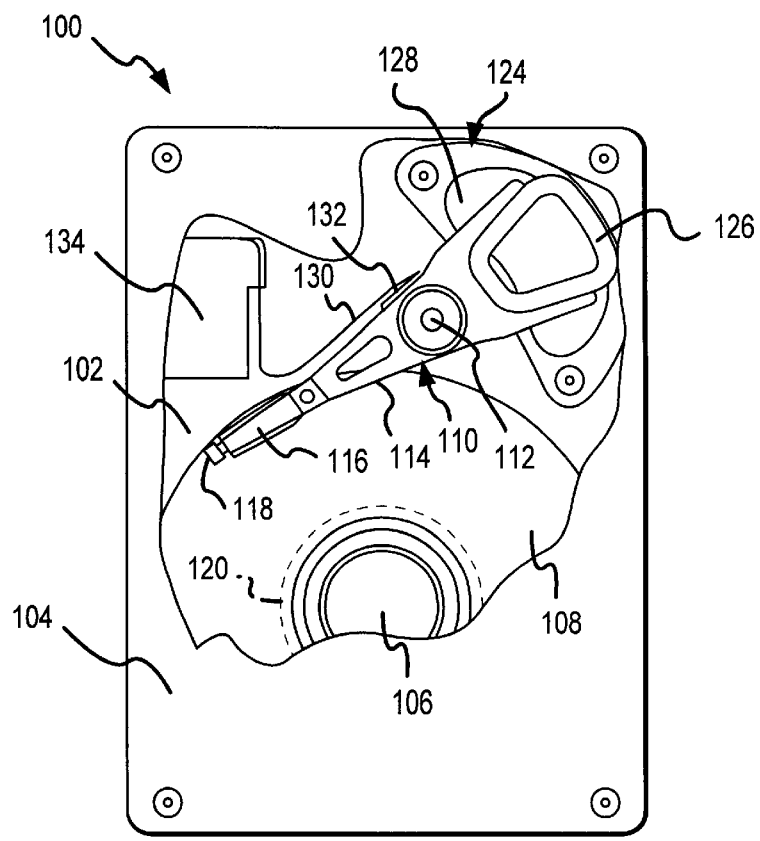
FIG. 1 is a plan view of a disc drive incorporating a preferred embodiment of an integrated circuit in accordance with the present invention.

DETAILED DESCRIPTION disc drive 100 constructed in accordance with a preferred embodiment of the present invention is shown in FIG. 1. The disc drive 100 includes a base 102 to which various components of the disc drive 100 are mounted. A top cover 104, shown partially cut away, cooperates with the base 102 to form an internal, sealed environment for the disc drive in a conventional manner. The components include a spindle motor 106 which rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114. Mounted at the distal end of each of the flexures 116 is a head 118 which includes an air bearing slider enabling the head 118 to fly in close proximity above the corresponding surface of the associated disc 108.

The track position of the heads 118 is controlled, during a seek operation, through the use of a voice coil motor (VCM) 124, that typically includes a coil 126 attached to the actuator assembly 110, as well as one or more permanent magnets 128 that establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surfaces of the discs 108.

The spindle motor 106 is typically de-energized when the disc drive 100 is not in use for extended periods of time. The heads 118 are moved over park zones 120 near the inner diameter of the discs 108 when the drive motor is de-energized. The heads 118 are secured over the park zones 120 through the use of an actuator latch arrangement, which prevents inadvertent rotation of the actuator assembly 110 when the heads are parked.

A flex assembly 130 provides the requisite electrical connection paths for the actuator assembly 110 while allowing pivotal movement of the actuator assembly 110 during operation. The flex assembly includes a printed circuit board 132 to which head wires (not shown) are connected; the head wires being routed along the actuator arms 114 and the flexures 116 to the heads 118. The printed circuit board 132 typically includes circuitry for controlling the write currents applied to the heads 118 during a write operation and a preamplifier for amplifying read signals generated by the heads 118 during a read operation. The flex assembly terminates at a flex bracket 134 for communication through the base deck 102 to a disc drive printed circuit board (not shown) mounted to the bottom side of the disc drive 100.

Figure 2:
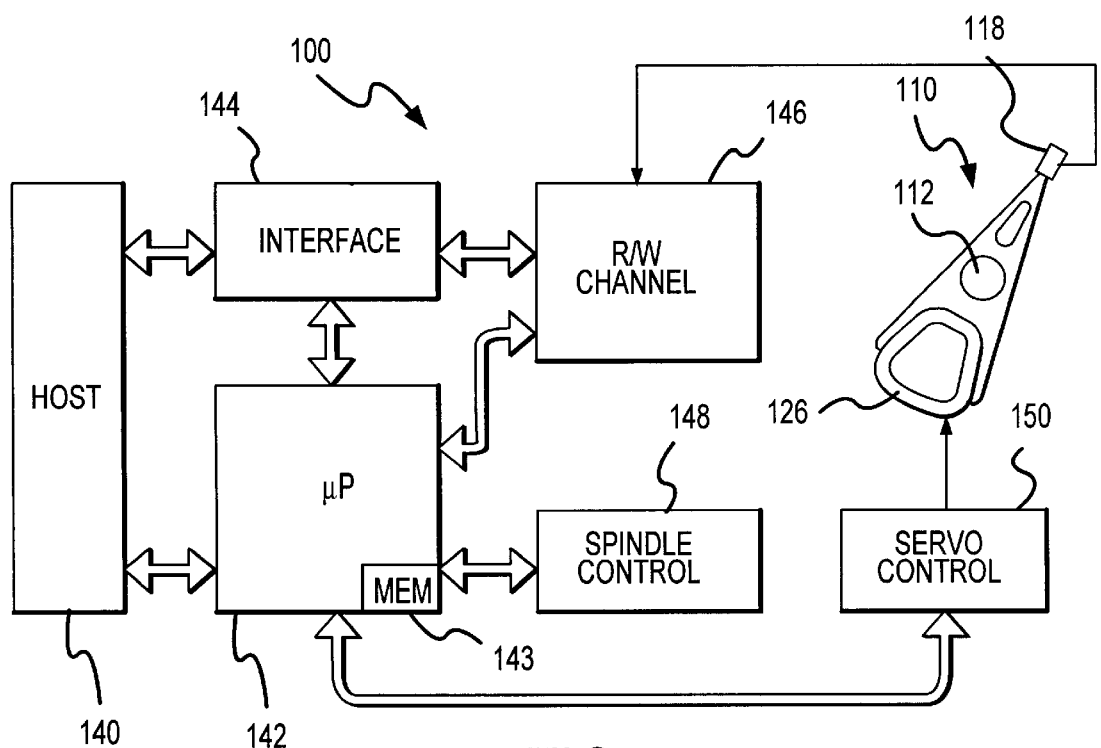
FIG. 2 is a simplified functional block diagram of the disc drive shown in FIG. 1.

Referring now to FIG. 2, shown therein is a functional block diagram of the disc drive 100 of FIG. 1, generally showing the main functional circuits which are resident on the disc drive printed circuit board and used to control the operation of the disc drive 100. The disc drive 100 is shown in FIG. 2 to be operably connected to a host computer 140 in which the disc drive 100 is mounted in a conventional manner. Control communication paths are provided between the host computer 140 and a disc drive microprocessor 142, the microprocessor 142 generally providing top level communication and control for the disc drive 100 in conjunction with programming for the microprocessor 142 stored in microprocessor memory (MEM) 143. The MEM 143 can include random access memory (RAM), read only memory (ROM) and other sources of resident memory for the microprocessor 142.

Figure 6:
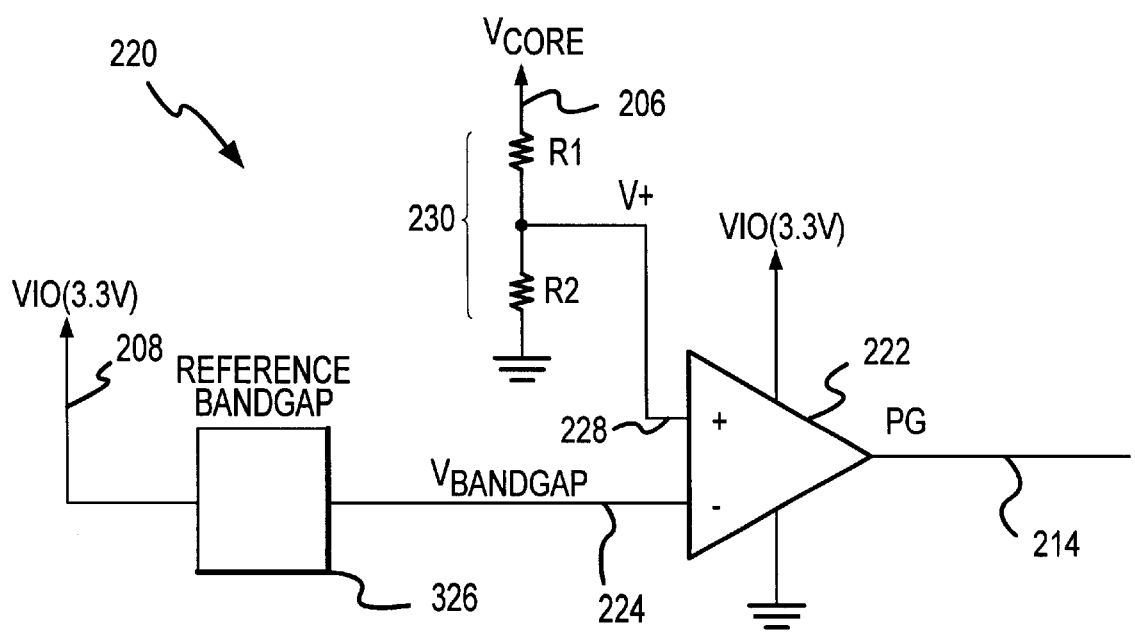
FIG. 6 is a simplified schematic diagram of the level detect circuit block in the mixed voltage integrated circuit in FIG. 4.

The level detect module 212 is powered by the I/O voltage, not the core voltage 206. The level detect module 212 provides a "CVGood" signal to the mode switch input 214 to the I/O buffers 204 when the Core Voltage 206 is within a predetermined operating tolerance level. A simplified schematic of the level detect circuit 220 in the level detect module 212 is shown in FIG. 6. The level detect circuit 220 includes a comparator 222 which has its negative input 224 connected to a reference bandgap block 226. The bandgap block 226 has its input connected to the I/O voltage line 208. The positive input 228 of the comparator 222 is connected between a pair of resistors R1 and R2 forming a voltage divider network 230 which is connected to Core Voltage. When the voltage (V+) on the positive input 228 is greater than the voltage on the negative input 224 ($V_{bandgap}$), the comparator 222 will output a logic 1 on the mode switch input 214. When the V+ is less than $V_{bandgap}$, the comparator 222 will output a logic 0. R1 and R2 are selected such that the voltage V+ on the positive input 228 of the comparator 222 will be greater than the $V_{bandgap}$ only when the Core voltage is above a predetermined safe operating level. In turn, the output of the comparator 222, if a logic 0, instructs the I/O buffers to be in the Default Mode. If the output of the comparator 222 is a logic 1, the I/O buffers 204 operate in a Core Logic Mode. Thus, whenever the core voltage is below a predetermined value, the comparator 222 outputs a logic 0 and thus the I/O buffers 204 operate in the Default Mode. This ensures that the I/O buffers are in a known, determined state whenever the core voltage is low, such as on a power reset, power down or power up scenario. Only when the core voltage exceeds a predetermined level with the I/O voltage present will the I/O buffers switch from the Default Mode to the Core Logic Mode. The level detect circuit 220 thus also protects the core logic by ensuring that the mode switches back to the Default Mode whenever the Core Voltage falls below the predetermined threshold determined by R1/R2.

Figure 3:
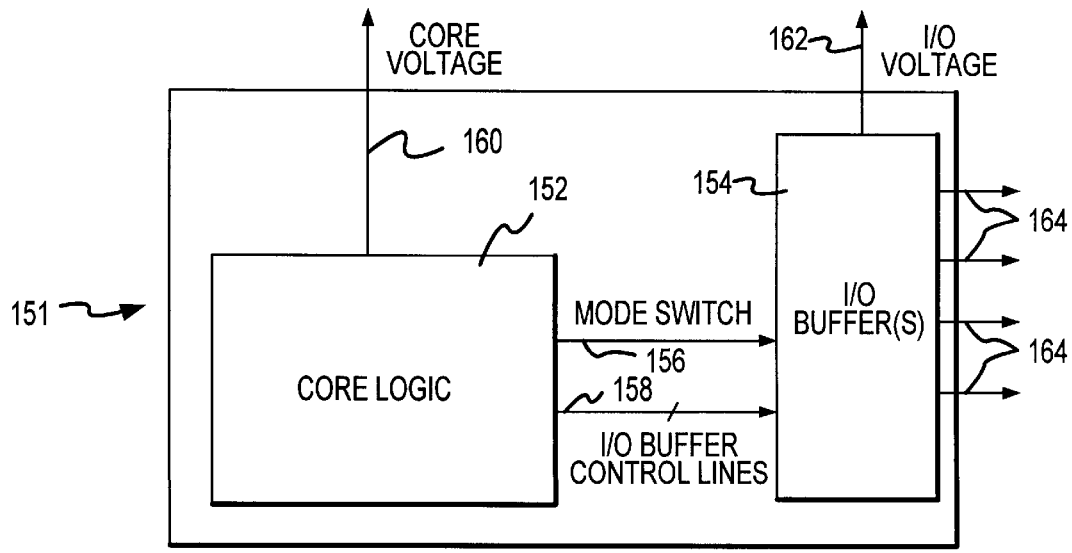
FIG. 3 is a schematic block diagram of a mixed voltage integrated circuit in accordance with a first preferred embodiment of the present invention.

This configuration is illustrated in the block diagram of FIG. 3. The second embodiment has a separate level detect module that connects to the Mode Switch Input of the I/O buffer.

The mixed voltage integrated circuit 151, shown in FIG. 3, includes a core logic module 152 and one or more Input/Output (I/O) buffers 154. The core logic module 152 has a mode switch line 156 and I/O buffer control lines 158 connected between the core logic 152 and the I/O buffers 154. The core logic module 152 also has a core voltage output line 160. The I/O buffers 154 have an I/O output voltage line 162 as well as a number of data output lines 164.

Figure 7:
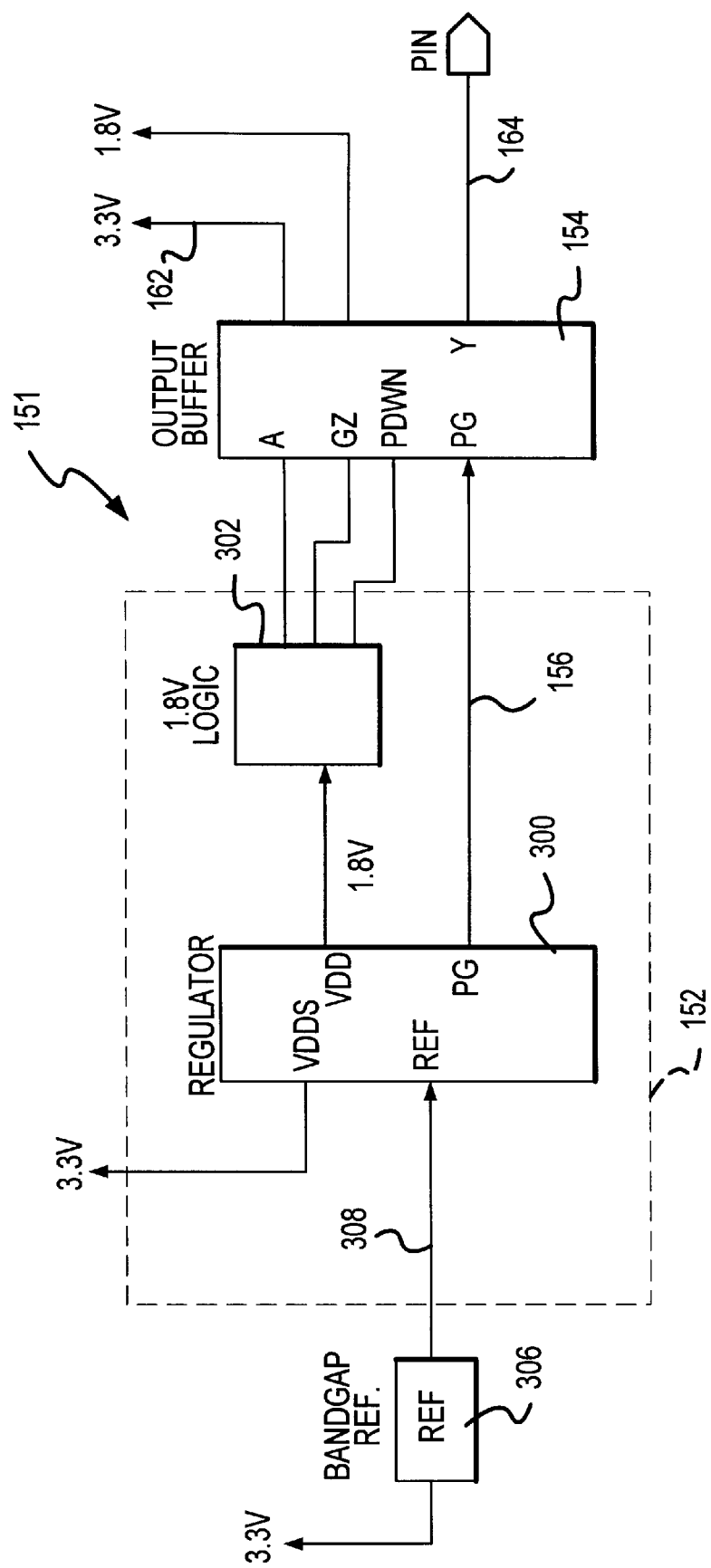
FIG. 7 is a simplified schematic diagram of the preferred embodiment of the integrated circuit shown in FIG. 3.

More specifically, FIG. 7 is a simplified schematic representation of the "power good" sensing portions of the integrated circuit 151. The core logic module 152 includes a regulator 300 and the 1.8 volt core logic 302. 1.8 volt power is generated by the regulator 300. A 3.3 volt supply voltage is connected to the Vdds pin of the voltage regulator 300. The output 308 of a bandgap reference voltage circuit 306 is connected via line 308 to the REF pin on the regulator 300. The bandgap reference circuit 306 provides a stable reference to the voltage regulator 300 so that it can produce a stable 1.8 volt supply. The voltage regulator circuit 300 has a "PG" output pin which provides a power good signal on the mode switch line 156 to the I/O buffers 154. This PG signal is a logical 1 if and only if the core logic voltage (1.8 v) is present and within a safe operating level. The regulator circuit 300 provides a logical 0 on the mode switch line 156 at all other times.

Figure 5:
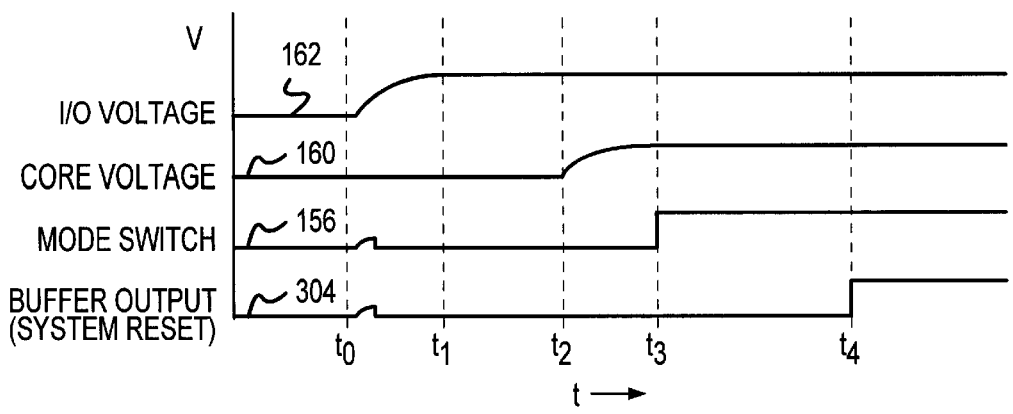
FIG. 5 is a timing diagram of the various voltages illustrating the timing of the integrated circuit in FIG. 3.

FIG. 5 illustrates the timing in the core logic module 152 on the mode switch line 156 upon startup or power-up of the circuit 151 in relation to the I/O voltage, Core Voltage, and System reset signals. At time $t_0$, no power is applied to the system. At this point in time, the I/O buffer output is maintained low, the mode switch line 156 is low and the I/O voltage line 162 is low. During the power up sequence, the I/O voltage goes to its nominal voltage, e.g. 3.3 volts, at $t_1$. During this time the I/O buffer outputs remain low. Then, at $t_2$, the core voltage is applied and goes to a stable safe operating level, e.g., 1.8 volts. Meanwhile, the mode switch remains low from $t_0$ until $t_3$. When the core voltage has reached a safe operating level, e.g., 1.8 volts, at $t_3$, the mode switch is asserted high. After the core logic determines that all system reset requirements have been met, at time $t_4$, the core logic de-asserts the I/O buffer output, i.e., the I/O output goes high and the system is released from reset.

Figure 4:
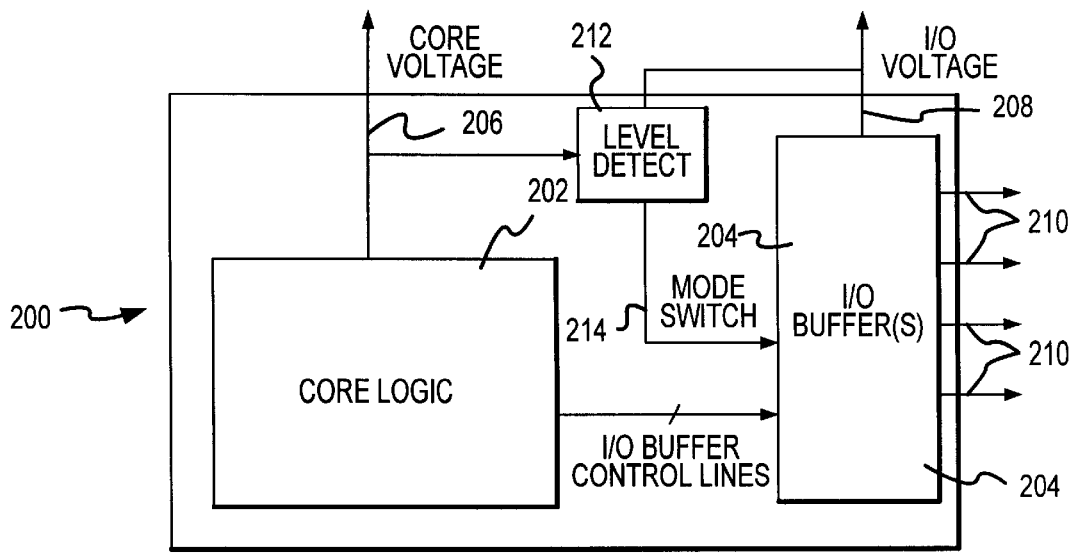
FIG. 4 is a schematic block diagram of a mixed voltage integrated circuit in accordance with a second preferred embodiment of the present invention.

In the second embodiment, shown in FIGS. 4 and 6, the integrated circuit 200 also includes a core logic module 202 and I/O buffers 204. The core logic 202 has a core voltage line 206 which is typically at 1.8 volts and the I/O buffers 204 has an I/O voltage line 208 which is typically at 3.3 volts. The I/O buffers 204 also have a number of data output lines 210. However, in this second embodiment 200, the mode switch input 214 does not run from the core logic module 202 directly to the I/O buffers 204. Instead, a level detect circuit module 212 is connected between the core voltage line 206 and the I/O voltage output line 208 with its output feeding the mode switch input 214. In addition, the output buffers are operated in one of two modes: Default Mode or Core Logic Mode. When both I/O voltage and Core voltage are present, the output buffers are operated in the Core Logic Mode. If not, the output buffers 204 revert to the Default Mode.

The level detect module 212 is powered by the I/O voltage, not the core voltage 206. The level detect module 212 provides a "CVGood" signal to the mode switch input 214 to the I/O buffers 204 when the Core Voltage 206 is within a predetermined operating tolerance level. A simplified schematic of the level detect circuit 220 in the level detect module 212 is shown in FIG. 4. The level detect circuit 220 includes a comparator 222 which has its negative input 224 connected to a reference bandgap block 226. The bandgap block 226 has its input connected to the I/O voltage line 208. The positive input 228 of the comparator 222 is connected between a pair of resistors R1 and R2 forming a voltage divider network 230 which is connected to the Core Voltage. When the voltage (V+) on the positive input 228 is greater than the voltage on the negative input 224 ($V_{bandgap}$), the comparator 222 will output a logic 1 on the mode switch input 214. When the V+ is less than $V_{bandgap}$, the comparator 222 will output a logic 0. R1 and R2 are selected such that the voltage V+ on the positive input 228 of the comparator 222 will be greater than the $V_{bandgap}$ only when the Core voltage is above a predetermined safe operating level. In turn, the output of the comparator 222, if a logic 0, instructs the I/O buffers to be in the Default Mode. If the output of the comparator 222 is a logic 1, the I/O buffers 204 operate in a Core Logic mode. Thus, whenever the core voltage is below a predetermined value, the comparator 222 outputs a logic 0 and thus the I/O buffers 204 operate in the Default mode. This ensures that the I/O buffers are in a known, determined state whenever the core voltage is low, such as on a power reset, power down or power up scenario. Only when the core voltage exceeds a predetermined level with the I/O voltage present will the I/O buffers switch from the Default Mode to the Core Logic Mode. The level detect circuit 220 thus also protects the core logic by ensuring that the mode switches back to the Default Mode whenever the Core Voltage falls below the predetermined threshold determined by R1/R2.

In summary, the present invention may be viewed as an integrated circuit (such as 151 or 200) that has a core logic module (such as 152 or 202) connected to a core voltage (such as 160 or 206), an input/output buffer module (such as 154 or 204) connected to an input/output voltage (such as 162 or 208), and input/output buffer control lines (such as 158) that are connected to the core logic module, and a mode switch input (such as 156 or 214) on the I/O buffer module (such as 154 or 204). The mode switch input is operable to prevent output operation of the I/O buffers (such as 154 or 204) whenever core voltage (such as 160 or 206) is below a safe operating level.

One preferred embodiment (such as 151) is configured with the core logic module (such as 152) operably connected to the mode switch input (such as 156) on the I/O buffer module (such as 154). The core logic module (such as 152) itself determines when the safe operating level is met.

Another preferred embodiment (such as 200) is configured to have the mode switch input (such as 214) connected to a level detect module (such as 212) that is operably connected to the core voltage (such as 206) and the input/output voltage (such as 208). The level detect module (such as 212) determines when the safe operating level is met in this embodiment. The level detect module (such as 212) has a comparator (such as 222) that compares the core voltage (such as 206) to a reference voltage (such as 224) to determine the safe operating level. This comparator (such as 222) preferably has a voltage divider (such as 230) connected to the core voltage (such as 206) and to a positive input (such as 228) of the comparator (such as 222). An input/output reference voltage (such as 208) is connected to a negative input (such as 224) of the comparator (such as 222). The comparator is powered by the input/output voltage (such as 208).

Stated another way, the present invention may be viewed as an integrated circuit (such as 200) having an input/output (I/O) buffer (such as 204) connected to a core logic module (such as 202). The core logic module (such as 202) is connected to a core voltage (such as 206). The I/O buffer (such as 204) is connected to an I/O voltage (such as 208). A level detect module (such as 212) is connected to the core voltage (such as 206) and the I/O voltage (such as 208) and to a mode switch input (such as 214) on the I/O buffer (such as 204). The level detect module (such as 212) is operable to control the I/O buffer (such as 204) between a Default Mode preventing I/O buffer output and a Core Logic Mode permitting I/O buffer output from the core logic module (such as 202). The level detect module (such as 212) operates to prevent output of the I/O buffer (such as 204) unless the core voltage (such as 206) is at a predetermined level.

The level detect module (such as 212) has a comparator (such as 222) connected to the I/O voltage (such as 208) and has an input (such as 228) connected to the core voltage (such as 206) through a voltage divider (such as 230). The comparator (such as 222) has another input 15 such as 224) connected to a reference voltage (such as 226). The reference voltage (such as 226) is connected to the I/O voltage (such as 208).

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What claimed is:

1. An integrated circuit comprising:
   a core logic module connected to a core voltage;
   a level sensing circuit coupled to the core logic module;
   an input/output buffer module connected to an input/output voltage and having input/output buffer control lines connected to the core logic module; and
   a mode switch input circuit on the I/O buffer module coupled to the level sensing circuit and being operable to prevent output operation of the I/O buffer module whenever the core voltage is below a safe operating level detected by the level sensing circuit.

2. The circuit according to claim 1 wherein the core logic module is operably connected to the mode switch input on the I/O buffer module and the core logic module includes the level sensing circuit that determines when the safe operating level is met.

3. The circuit according to claim 1 wherein the mode switch input circuit is connected to a level detect module operably connected to the core voltage and the input/output voltage, the level detect module including the level sensing circuit that determines when the safe operating level is met.

4. The circuit according to claim 3 wherein the level detect module has a comparator comparing the core voltage to a reference voltage to determine the safe operating level.

5. The circuit according to claim 4 wherein the comparator has a voltage divider connected to the core voltage and a positive input of the comparator and an input/output reference voltage connected to a negative input of the comparator.

6. The circuit according to claim 5 wherein the comparator is powered by the input/output voltage.

7. The circuit according to claim 4 wherein the reference voltage is connected to the input/output voltage.

8. An integrated circuit comprising:

a core logic module connected to a core voltage;

an input/output (I/O) buffer connected to the core logic module and an I/O voltage;

a level detect module connected to the core voltage and the I/O voltage and to a mode switch input circuit on the I/O buffer operable to control the I/O buffer between a Default Mode preventing I/O buffer output and a Core Logic Mode permitting I/O buffer output from the core logic module, wherein the level detect module operates to prevent output of the I/O buffer unless the core voltage is at a safe operating level.

9. The circuit according to claim 8 wherein the level detect module has a comparator connected to the core voltage and has an input connected to the core voltage through a voltage divider.

10. The circuit according to claim 9 wherein the comparator has another input connected to a reference voltage.

11. The circuit according to claim 10 wherein the reference voltage is connected to the I/O voltage.

12. An integrated circuit comprising:

a core logic module;

an input/output (I/O) buffer connected to the core logic module; and means connected to a core voltage and an I/O voltage for controlling operation of the I/O buffer to permit operation of the I/O buffer only when core voltage is at a safe operating level.

* * * * *

UNITED STATES PATENT AND TRADEMARK OFFICE
CERTIFICATE OF CORRECTION

PATENT NO. : 6,342,802 B1  
DATED : January 29, 2002  
INVENTOR(S) : Monty A. Forehand It is certified that error appears in the above-identified patent and that said Letters Patent is hereby corrected as shown below:

Column 2,  
Line 29, at the beginning of the sentence insert -- A --.

Column 6,  
Line 22, replace "15" with -- ( --.

Signed and Sealed this

Tenth Day of September, 2002

*Attest:*

*Attesting Officer*

JAMES E. ROGAN  
*Director of the United States Patent and Trademark Office*

UNITED STATES PATENT AND TRADEMARK OFFICE
CERTIFICATE OF CORRECTION

PATENT NO. : 6,342,802 B1
DATED : January 29, 2002
INVENTOR(S) : Monty Aaron Forehand It is certified that error appears in the above-identified patent and that said Letters Patent is hereby corrected as shown below:

<u>Column 3,</u>
Lines 31-67, replace the paragraph with the following:

The discs 108 are rotated at a constant high speed by a spindle control circuit 148, which typically electrically commutates the spindle motor 106 (FIG. 1) through the use of back electromotive force (BEMF) sensing. During a seek operation, the track position of the heads 118 is controlled through the application of current to the coil 126 of the actuator assembly 110. A servo control circuit 150 provides such control. During a seek operation the microprocessor 142 receives information regarding the velocity and acceleration of the head 118, and uses that information in conjunction with a model, stored in memory 143, to communicate with the servo control circuit 150, which will apply a controlled amount of current to the voice coil motor 126, thereby causing the actuator assembly 110 to be pivoted.
    Data is transferred between the host computer 140 and the disc drive 100 by way of a disc drive interface 144, which typically includes a buffer to facilitate high speed data transfer between the host computer 140 and the disc drive 100. Data to be written to the disc drive 100 are thus passed from the host computer to the interface 144 and then to a read/write channel 146, which encodes and serializes the data and provides the requisite write current signals to the heads 118. To retrieve data that has been previously stored by the disc drive 100, read signals are generated by the heads 118 and provided to the read/write channel 146, which performs decoding and error detection and correction operations and outputs the retrieved data to the interface 144 for subsequent transfer to the host computer 140.
    A first embodiment of the integrated circuit in accordance with the present invention that may be utilized in the interface 144 is shown in FIGS. 3 and 7. A second embodiment is shown in FIGS. 4 and 6. In the first embodiment, the I/O buffer includes an additional logic added to the core logic that connects to a Mode Switch Input of the I/O buffer.

<u>Column 5,</u>
Line 4, replace "4" with -- 6 --.
Lines 22 and 25, replace "mode" with -- Mode --.

<u>Column 8,</u>
Line 4, replace "I/O" with -- core --.

Signed and Sealed this

Twenty-sixth Day of August, 2003

JAMES E. ROGAN
*Director of the United States Patent and Trademark Office*